United States Patent
Khlat et al.

(10) Patent No.: US 8,189,717 B2
(45) Date of Patent: *May 29, 2012

(54) LOW IF RADIO RECEIVER

(75) Inventors: Nadim Khlat, Cugnaux (FR); Conor O'Keefe, Douglas (IE); Patrick J. Pratt, Mallow (IE)

(73) Assignee: Freescale Semiconductor, Inc., Austin, TX (US)

( * ) Notice: Subject to any disclaimer, the term of this patent is extended or adjusted under 35 U.S.C. 154(b) by 146 days.

This patent is subject to a terminal disclaimer.

(21) Appl. No.: 12/705,836

(22) Filed: Feb. 15, 2010

(65) Prior Publication Data

US 2010/0144301 A1 Jun. 10, 2010

Related U.S. Application Data

(63) Continuation of application No. 10/596,910, filed as application No. PCT/EP2004/014913 on Dec. 22, 2004, now Pat. No. 7,697,632.

(30) Foreign Application Priority Data

Dec. 29, 2003 (EP) ..................................... 03293343

(51) Int. Cl.
  *H03K 9/00* (2006.01)
  *H04L 27/00* (2006.01)
(52) U.S. Cl. ........................................ 375/316; 375/350
(58) Field of Classification Search .................. 375/316, 375/331, 350; 455/130–131, 313–315, 318, 455/232

See application file for complete search history.

(56) References Cited

U.S. PATENT DOCUMENTS

| | | | |
|---|---|---|---|
| 6,487,219 B1 * | 11/2002 | Snider | 370/478 |
| 6,597,748 B1 | 7/2003 | Hietala et al. | |
| 6,804,261 B2 * | 10/2004 | Snider | 370/478 |
| 6,829,469 B1 | 12/2004 | Henriksson | |
| 7,010,271 B2 * | 3/2006 | Melanson | 455/71 |
| 7,120,413 B2 | 10/2006 | Lee et al. | |
| 7,136,431 B2 | 11/2006 | Shi et al. | |
| 7,277,688 B2 | 10/2007 | Yang et al. | |
| 2002/0065057 A1 | 5/2002 | Kasperkovitz | |
| 2002/0183030 A1 | 12/2002 | Damgaard et al. | |
| 2004/0198275 A1 | 10/2004 | Loke | |

FOREIGN PATENT DOCUMENTS

| | | |
|---|---|---|
| EP | 1241779 A2 | 9/2002 |
| EP | 1058378 B1 | 8/2005 |

OTHER PUBLICATIONS

International Application No. PCT/EP2004/014913 Search Report and Written Opinion dated Mar. 5, 2005.

* cited by examiner

Primary Examiner — Jean B Corrielus

(57) ABSTRACT

A slot-based radio signal at a carrier frequency is received, the radio signal including successive frames, each frame including a set of reception time slots, to producing an input signal. A local oscillator signal is produced, In-phase and Quadrature components having a local oscillator frequency. The input signal is mixed with the local oscillator signal and Intermediate Frequency signal In-phase and Quadrature components are produced. The local oscillator frequency of the local oscillator signal changes relative to the carrier frequency of the input signal multiple times during the reception time slots of each of the frames between two frequency values. One frequency is greater and the other frequency is smaller than the carrier frequency. Frequencies of Intermediate Frequency components are selectively passed within a low Intermediate Frequency range and frequencies outside said low Intermediate Frequency range are rejected so as to produce filtered signal components.

15 Claims, 4 Drawing Sheets

LOW IF RADIO RECEIVER

FIELD OF THE INVENTION

This invention relates to a low Intermediate Frequency ('IF') radio receiver and especially, but not exclusively, to Very Low IF ('VLIF') receivers. The expression "low IF" refers to intermediate frequencies that are comparable with the bandwidth of the resulting baseband signal and VLIF to intermediate frequencies that are much smaller than the bandwidth of the resulting baseband signal.

BACKGROUND OF THE INVENTION

Very Low IF receivers are widely used for slot-based radio communications and, in particular Time Division Multiple Access ('TDMA') protocols such as the Global System for Mobile communications ('GSM'), Digital Enhanced Cordless Telecommunications ('DECT') and Enhanced Data for GSM Evolution ('EDGE'), in the General Packet Radio Service (GPRS), an extension to the GSM standard that provides higher speed access. These receivers need to reject interferer signals that fall as image frequencies on or very close to the wanted signal when the wanted signal is translated to the desired intermediate frequency. This is achieved through image cancelling mixers or poly-phase filters at low frequency. The success of these image cancelling techniques depends upon the balance achieved in terms of phase and gain of the I (in phase) and Q (quadrature phase) paths in the receiver. Patent specifications U.S. Pat. No. 6,597,748 and EP 1 058 378 describe receivers of this kind.

The balance of I and Q in the receiver may be achieved by precision analogue design and by compensation in the form of a digital equaliser. This adds cost in terms of yield, software overhead, manufacturing overhead and extra hardware. Moreover, the image rejection varies with temperature and frequency band.

The image channel is often one of the adjacent frequency channels or alternate adjacent channels to the wanted one. The other adjacent or alternate adjacent channel is not an image frequency and can be rejected adequately without the need for such accurate quadrature balance. Instead it is easily rejected by standard filter topologies. Selectivity is especially a problem for alternate channels on the 'low side' IF, that is to say where the local oscillator ('LO') frequency used to convert the carrier frequency down to IF is smaller than the carrier frequency, so that the IF is positive, regarding interferers at twice channel spacing (400 kHz in the example shown in FIG. 2 of the accompanying drawings) since the receiver treats them like an image and part of the interferer spectrum falls in band.

Patent specification US2002/0183030 describes radio receiver and transmitter apparatus that includes Local Oscillator (LO) frequencies $Low_{LO}$ and $High_{LO}$ selectable based on the frequency band of operation of the mobile communication device in the transmitter, whereas in the receiver the LO inputs $Low_{LO}$ and $High_{LO}$ are connected to different receiver paths via a sub-harmonic mixer.

The specifications for low IF radio receivers include stringent requirements regarding the rejection of interferers and there is a need to meet or surpass these specifications at minimal cost.

SUMMARY OF THE INVENTION

The present invention provides a radio receiver as described in the accompanying claims.

DETAILED DESCRIPTION OF THE PREFERRED EMBODIMENTS

Figure 1:
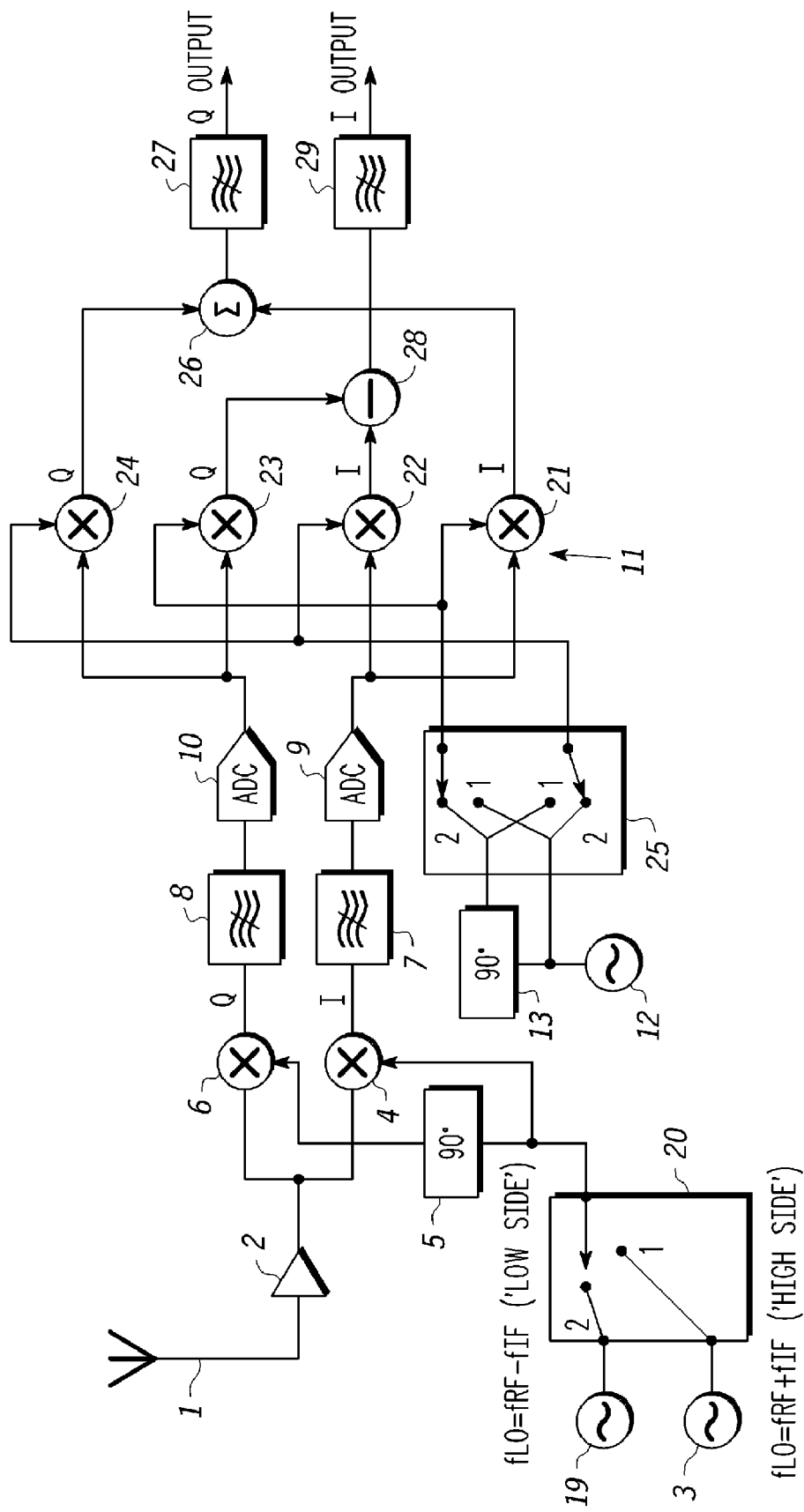
FIG. 1 is a block schematic diagram of a hardware implementation of a receiver in accordance with one embodiment of the invention, given by way of example.

The receiver shown in FIG. 1 comprises an antenna 1 for supplying received radio signals to an amplifier 2. A 'High Side' local oscillator 3 produces a local oscillator signal at a frequency $f_{LO}$ higher than the wanted channel frequency $f_{wanted}$, so that $f_{LO}=f_{wanted}+f_{IF}$. The signal from the High Side local oscillator 3 is supplied to an I-channel mixer 4 and to a phase shifter 5 that shifts the phase of the signal from the High Side local oscillator 3 by 90° and supplies the phase-shifted signal to a Q-channel mixer 6. The I- and Q-channel mixers 4 and 6 mix the received signal from the amplifier 2 with the local oscillator signals to produce low IF signals (in the present case VLIF signals) in phase quadrature and supply the low IF signals to I- and Q-low-pass-filters 7 and 8. The filtered analogue signals from the filters 7 and 8 are then converted to digital signals by analogue-to-digital converters ('ADCs') 9 and 10 respectively and down-converted from VLIF to DC in a digital mixer stage 11 that mixes the signals from the ADCs 9 and 10 with a VLIF local oscillator signal from a VLIF local oscillator 12 and from a further 90° phase-shifter 13.

Figure 2:
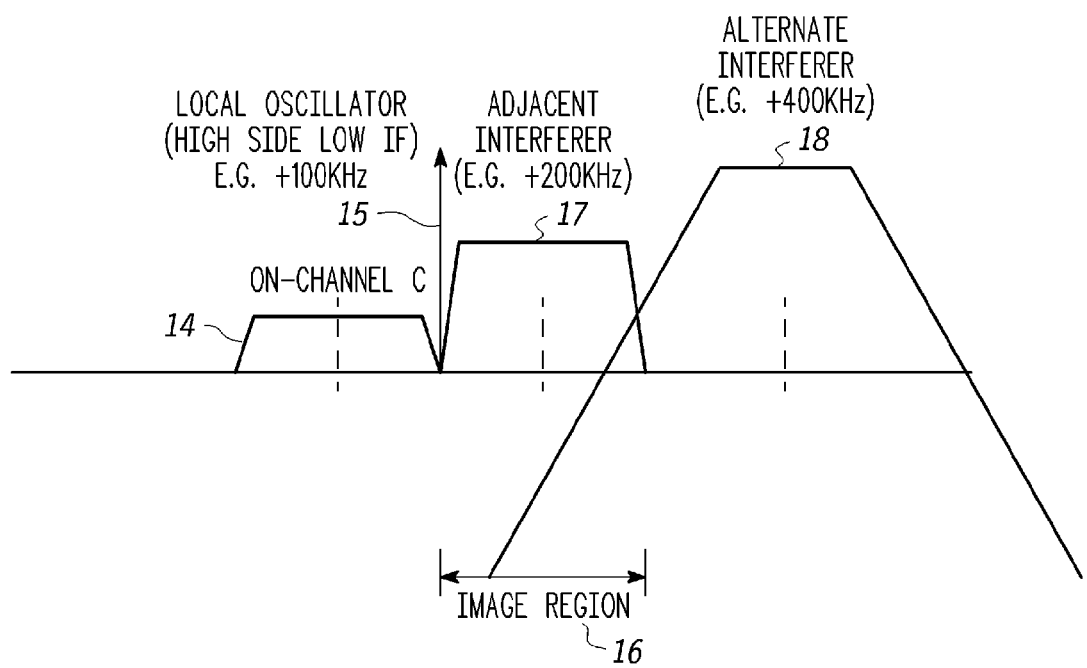
FIG. 2 is a diagram of the frequency spectrum of signals appearing during a first time slot in operation of the receiver of FIG. 1.

In operation, the wanted signal presents a bandwidth 14, shown in FIG. 2 as 200 kHz by way of example, corresponding to the GSM and EDGE channel widths. The frequency 15 of the local oscillator is higher than the centre frequency $f_{wanted}$ of the wanted channel 14 by an amount $f_{IF}$ equal in this example to 100 kHz. When mixed with the local oscillator signals, the wanted channel will be centred at a low IF frequency $-f_{IF}$ and signals from an image region 16 will appear in a region centred at a frequency $+f_{IF}$ and will be passed by frequency filters: this is the case for an interferer 17 from an adjacent channel or an alternate adjacent channel 18 centred at a frequency offset by $f_{interferer}$ (=200 kHz or 400 kHz in the example shown in FIG. 2 of the accompanying drawings) relative to the centre frequency $f_{wanted}$ of the wanted channel 14.

As described in patent specification U.S. Pat. No. 6,597,748, the image rejection depends on the gain and phase imbalances of the I- and Q-channels. Digital gain and phase correction as described in patent specification EP 1 058 378, for example, enables significant compensation of these errors to be achieved and gives a high degree of image rejection. However, as described above, it is desirable to improve image rejection since the receiver treats them like an image and part of the interferer spectrum falls in the wanted band. In particular, in certain applications, selectivity is desired to be at detected carrier to interference (C/I) levels better than 10 dB for a received interferer (I) at 41 dB greater than the carrier (C) where carrier is the wanted channel, even at carrier frequencies greater than 2 GHz.

Figure 3:
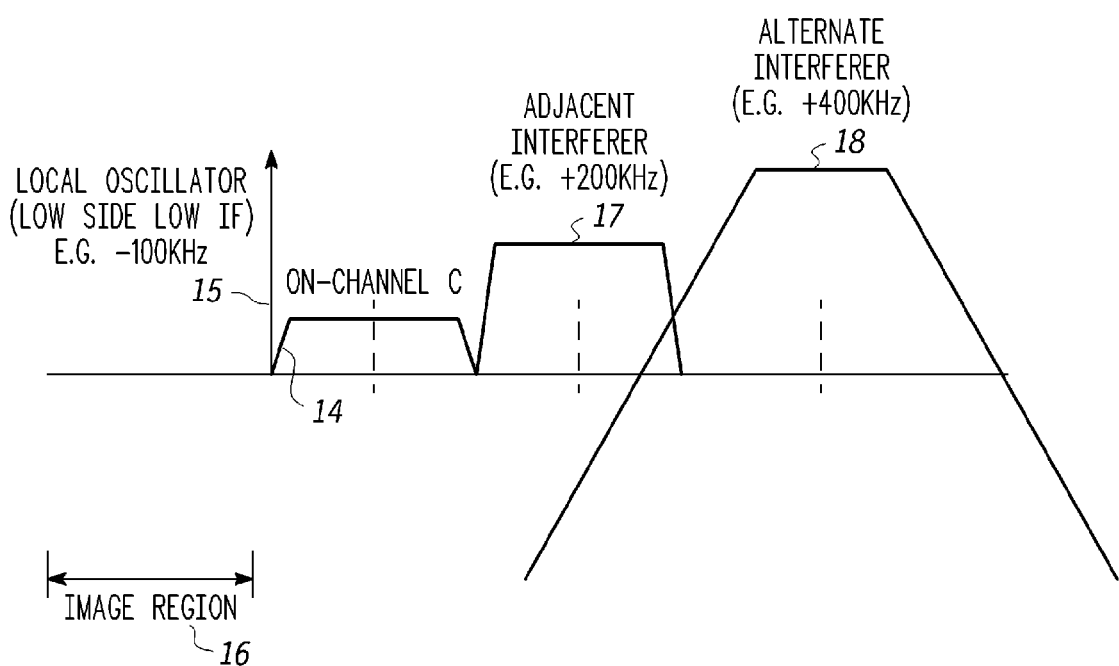
FIG. 3 is a diagram of the frequency spectrum of signals appearing during a subsequent time slot in operation of the receiver of FIG. 1.
Figure 4:
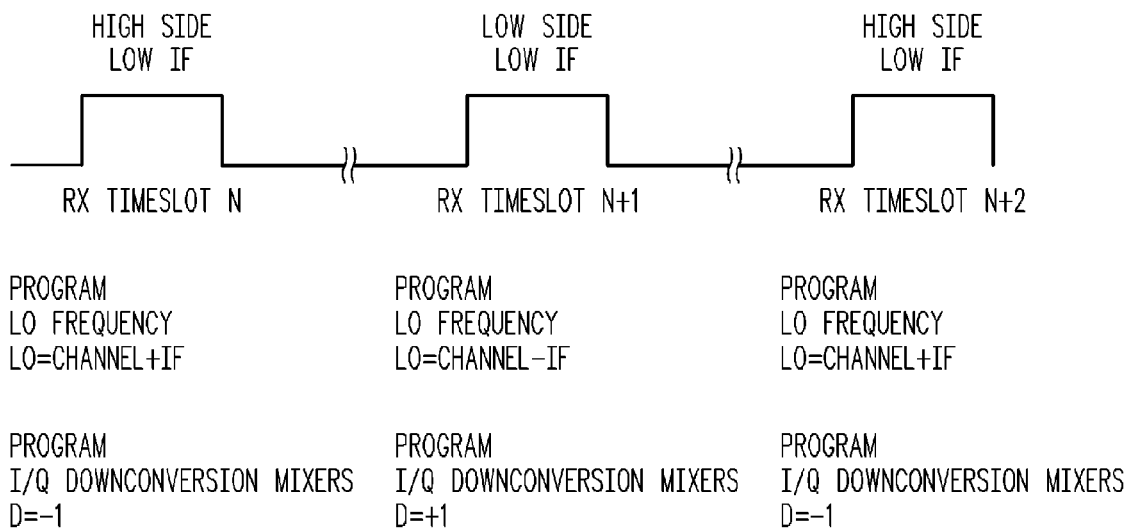
FIG. 4 is a diagram of the variation with time of parameters in operation of the receiver of FIG. 1.

In the embodiment of the invention shown in the drawings, the local oscillator means includes frequency alternation means for causing the local oscillator frequency to alternate in successive time-slots between first and second values one of which is greater and the other smaller than the desired carrier frequency of the input signal. More specifically, in the embodiment shown in FIG. 1, a Low Side local oscillator 19 is provided that produces a local oscillator signal at a frequency $f_{LO}$ lower than the wanted channel frequency $f_{wanted}$, so that $f_{LO}=f_{wanted}-f_{IF}$. The signals from the High Side local oscillator 3 and the Low Side local oscillator 19 are supplied to a two-position switch 20. The two-position switch 20 selects alternately the LO signals from the High Side and Low Side local oscillators 3 and 19 for alternate time slots of the received signals. The relationship between the frequencies of the wanted channel, the Low Side local oscillator 19, the image region 15 and the same interferers 17 and 18 when the Low Side local oscillator 19 is selected is then as shown in FIG. 3. It will be appreciated that the interferers then fall outside the image region 15 and are rejected by the frequency filters 7 and 8.

In order to maintain the polarities of the VLIF I- and Q-channel mixer stage 11, this mixer stage comprises first and second I-channel mixers 21 and 22 and first and second Q-channel mixers 23 and 24. A VLIF two-position switch 25 synchronised with the LO two-position switch 20 provides phase alternation and alternately applies the VLIF LO signal from the VLIF local oscillator 19 to the first I- and Q-mixers 21 and 23 in one time-slot and the phase-shifted VLIF LO signal from the VLIF phase shifter 13 to the second I- and Q-mixers 22 and 24 in the next time-slot. The I-mixers 21 and 22 mix these signals with the signal from the I-channel ADC 9 and the Q-mixers 23 and 24 mix these signals with the signal from the Q-channel ADC 10. The signals from the first I-mixer 21 and the second Q-mixer 24 are supplied to an adder 26, which adds the mixed signals to produce a Q-output signal at a Q-output 27 and the signals from the second I-mixer 22 and the first Q-mixer 23 are supplied to a subtractor 28, which subtracts the mixed signals to produce an I-output signal at a I-output 29.

The signal amplitudes and phases can be expressed as follows:

In the case where the Local RF oscillator is higher than the Wanted channel frequency, the High Side Low IF, the low IF receiver I,Q vector output can be expressed as:

$$I_{out}(t)+j \cdot Q_{out}(t)=A_w(t)/2 \cdot e^{-j \cdot \phi w(t)} ** H_{wanted}+$$
$$A_i(t)/2 \cdot e^{-j \cdot (\phi i(t)+2\cdot \prod finterferer \cdot t)} **$$
$$H_{wanted} \text{ (term } a) + A_w(t)/2 \cdot$$
$$e^{+j \cdot (\phi w(t)} \cdot 4 \cdot \prod fIF \cdot t) ** H_{image} +$$
$$A_i(t)/2 \cdot e^{+j \cdot (\phi i(t)+2 \cdot \prod \text{finterferer} \cdot t - 4 \cdot \prod fIF \cdot t)} ** H_{image} \text{ (term } b)$$

where $A_w(t)$ is the wanted channel amplitude signal,
where $\phi_w(t)$ is the wanted channel phase signal,
where $f_{IF}$ is the intermediate IF frequency,
where $A_i(t)$ is the interferer channel amplitude signal,
where $\phi_i(t)$ is the interferer channel phase signal,
where $F_{interferer}$ is the offset of the interferer frequency versus the wanted channel frequency (e.g in GSM the +400 khz alternate channel interferer case is considered),
where $H_{wanted}$ is the wanted channel filter impulse response expressed as $H_{wanted}=(H_I+H_Q)/2$ where $H_I$ is the I path channel impulse response and $H_Q$ is the Q path channel impulse response, and where $H_{image}$ is the Image channel filter impulse response expressed as $H_{image}=(H_I-H_Q)/2$ where $H_I$ is the I path channel impulse response and $H_Q$ is the Q path channel impulse response.

Ideally if $H_I=H_Q$, ie perfect quadrature over frequency, then $H_{image}$ is nullified.

The term b represents the image portion that will fall inside the RX band based on $H_{image}$ which is not nullified due to the non-ideal matching between I and Q paths, so for example if $f_{interferer}=2*f_{IF}$, the second portion of term b becomes:

$$A_i(t)/2 \cdot e^{+j \cdot (\phi i(t))} ** H_{image}$$

which is centered at 0 frequency, ie falling inside the wanted RX channel and the amplitude of this interference depends on the level of the interfence max($A_i(t)$) and the image rejection magnitude abs($H_{image}$).

In the case where the Local RF oscillator is lower than the Wanted channel frequency, ie fLO=fwanted−fFI, the Low Side Low IF, the low IF receiver I,Q vector output can be expressed as:

$$I_{out}(t)+j \cdot Q_{out}(t)=A_w(t)/2 \cdot e^{-j \cdot \phi w(t)} ** H_{wanted}+$$
$$A_i(t)/2 \cdot e^{-j \cdot (\phi i(t)+2 \cdot \prod finterferer \cdot t)} **$$
$$H_{wanted}(\text{term } a') + A_w(t)/2 \cdot e^{+j \cdot (\phi w(t)+4 \cdot \prod fFI \cdot t)} **$$
$$H_{image} + A_i(t)/2 \cdot e^{+j \cdot (\phi i(t)+2 \cdot \prod finterferer \cdot t + 4 \cdot \prod fFI \cdot t)} **$$
$$H_{image}(\text{term } b')$$

The term b' represents the image portion that will fall inside the RX band based on $H_{image}$ which is not nullified due to the non-ideal matching between I and Q paths, so for example if $f_{interferer}=2*f_{IF}$ (same interferer location as in the High Side case), the second portion of term b' becomes:

$$A_i(t)/2 \cdot e^{+j \cdot (\phi i(t)+2 \cdot \prod 4 fFI \cdot t)} ** H_{image}$$

which is centred at $4 \cdot f_{IF}$ frequency, ie falling outside the wanted receiver channel thus resulting in removing this contribution term during the time where the receiver is operating in Low side Low IF Mode.

Since the local oscillator frequency $f_{LO}$ alternates between High Side and Low Side, the outputs alternate between the values indicated and the average impact of the interferers present is reduced. It is not necessary to know on which side of the wanted frequency band the interferer frequency occurs, which is often not even possible, provided that the alternation between High Side and Low Side occurs several times while the interferer is on the same side of the wanted frequency band.

It will be appreciated that, instead of the implementation shown in FIG. 1, with two local oscillators 3 and 19, it is possible in certain applications to combine the two oscillators in one, the switch 20 then switching the output of this local oscillator between the two LO frequencies. This implementation is particularly useful where reception time-slots are separated by inactive reception periods, during which the local oscillator is changed and has time to stabilise at the new frequency before the start of the next reception time-slot. It will be appreciated that the hardware switches 20 and 25 shown in FIG. 1 may then be replaced by software switching of the local oscillator frequencies.

It will also be appreciated that in certain applications, it is not necessary to alternate the local oscillator frequency between the two LO frequencies at each successive time-slot, provided that the alternation occurs often compared to the fluctuations of the interferers that is to say many times in the same block (of 2000 slots in the case of GSM and EDGE).

Figure 5:
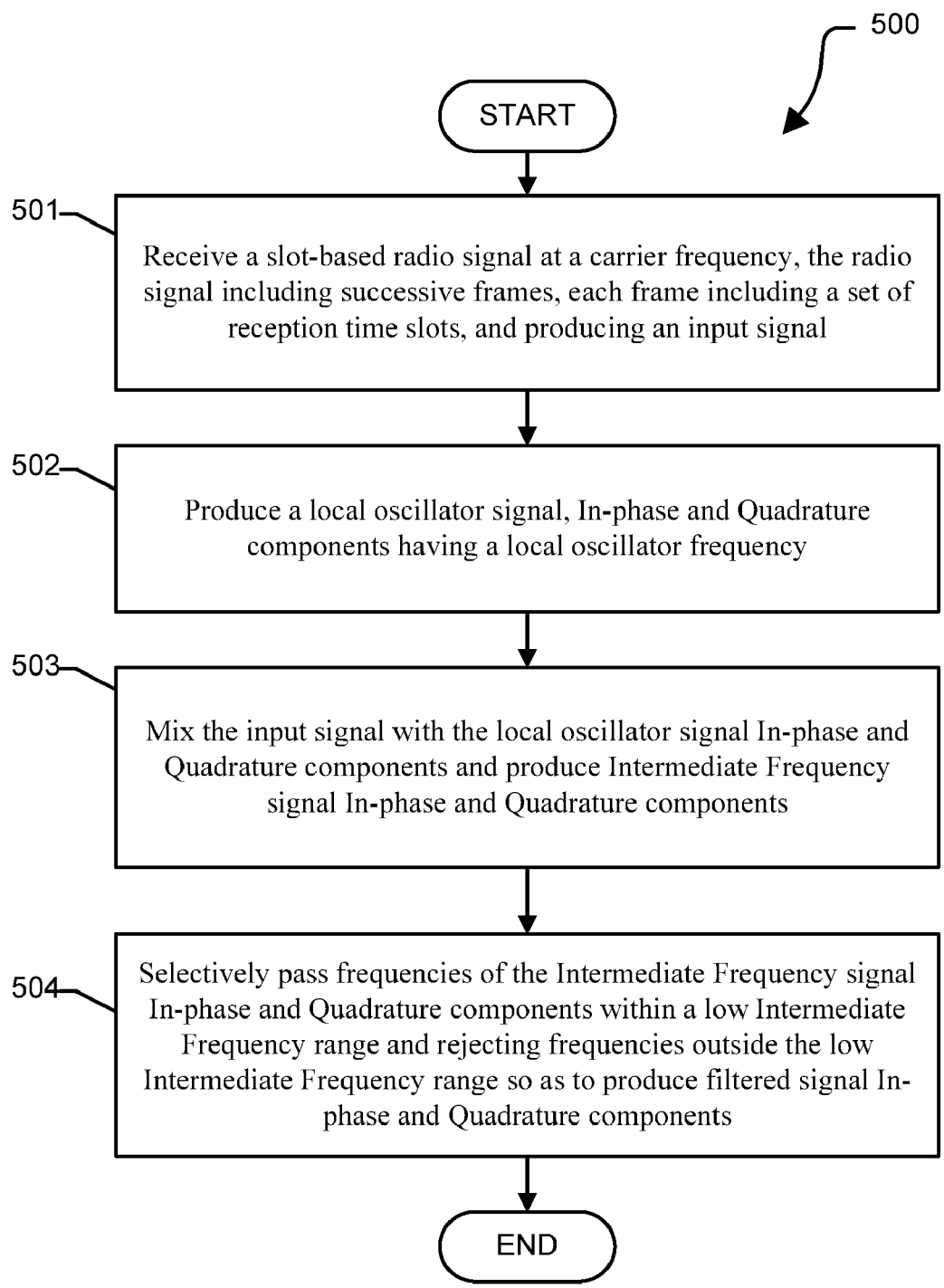
FIG. 5 is a flow diagram illustrating a method according to a specific embodiment of the present disclosure.

FIG. 5 is a flow diagram illustrating a method 500 according to a specific embodiment of the present disclosure. At block 501, a slot-based radio signal at a carrier frequency is received, the radio signal including successive frames, each frame including a set of reception time slots, and producing an input signal. At block 502, a local oscillator signal is produced, In-phase and Quadrature components having a local oscillator frequency. At block 503 the input signal is mixed with the local oscillator signal In-phase and Quadrature components and Intermediate Frequency signal In-phase and Quadrature components are produced. The local oscillator frequency of the local oscillator signal In-phase and Quadrature components changes relative to the carrier frequency of the input signal with which the local oscillator signal In-phase and Quadrature components are mixed multiple of times during the reception time slots of each of the frames between first and second frequency values. One frequency is greater and the other frequency is smaller than the carrier frequency. At block 504, frequencies of Intermediate Frequency signal In-phase and Quadrature components are selectively passed within a low Intermediate Frequency range and frequencies outside said low Intermediate Frequency range are rejected so as to produce filtered signal In-phase and Quadrature components.

The invention claimed is:

1. A method of low Intermediate Frequency quadrature radio reception comprising:
   receiving a slot-based radio signal at a carrier frequency, said radio signal comprising successive frames each comprising a set of reception time slots, and producing an input signal;
   producing local oscillator signal In-phase and Quadrature components having a local oscillator frequency;
   mixing said input signal with said local oscillator signal In-phase and Quadrature components and producing Intermediate Frequency signal In-phase and Quadrature components;
   wherein said local oscillator frequency of said local oscillator signal In-phase and Quadrature components changes relative to said carrier frequency of said input signal with which said local oscillator signal In-phase and Quadrature components are mixed a plurality of times during said reception time slots of each of said frames between first and second values one of which is greater and the other smaller than said carrier frequency; and
   selectively passing frequencies of said Intermediate Frequency signal In-phase and Quadrature components within a low Intermediate Frequency range and rejecting frequencies outside said low Intermediate Frequency range so as to produce filtered signal In-phase and Quadrature components.

2. A method of low Intermediate Frequency quadrature radio reception as claimed in claim 1, comprising:
   producing further local oscillator signal In-phase and Quadrature components having a further local oscillator frequency;
   mixing said filtered signal In-phase and Quadrature components with said further local oscillator signal In-phase and Quadrature components and producing baseband signal In-phase and Quadrature components; and
   selectively passing frequencies of said baseband signal In-phase and Quadrature components within a baseband frequency range and rejecting frequencies outside said baseband range.

3. A method of low Intermediate Frequency quadrature radio reception as claimed in claim 2, comprising:
   applying alternating phase shifts to said further local oscillator signal In-phase and Quadrature components in synchronism with said changes in said local oscillator frequency.

4. A method of low Intermediate Frequency quadrature radio reception as claimed in claim 3 comprising:
   alternating mixing of said further local oscillator signal In-phase and Quadrature components between said Intermediate Frequency signal In-phase and Quadrature components in synchronism with changes in said local oscillator frequency to produce alternating pairs of said baseband signal In-phase and Quadrature components; and
   alternating addition and subtraction of baseband signal In-phase components and Quadrature components of said alternating pairs of said baseband signal In-phase and Quadrature components to produce In-phase components and Quadrature output components.

5. A method of low Intermediate Frequency quadrature radio reception as claimed in claim 2 comprising:
   alternating mixing of said further local oscillator signal In-phase and Quadrature components between said Intermediate Frequency signal In-phase and Quadrature components in synchronism with changes in said local oscillator frequency to produce alternating pairs of said baseband signal In-phase and Quadrature components; and
   alternating addition and subtraction of baseband signal In-phase components and Quadrature components of said alternating pairs of said baseband signal In-phase and Quadrature components to produce In-phase components and Quadrature output components.

6. A method of low Intermediate Frequency quadrature radio reception as claimed in claim 1, wherein said local oscillator frequency is changed between said first and second values at each successive reception time slot of each of said frames.

7. A method of low Intermediate Frequency quadrature radio reception as claimed in claim 2, wherein said local oscillator frequency is changed between said first and second values at each successive reception time slot of each of said frames.

8. A method of low Intermediate Frequency quadrature radio reception as claimed in claim 3, wherein said local oscillator frequency is changed between said first and second values at each successive reception time slot of each of said frames.

9. A method of low Intermediate Frequency quadrature radio reception as claimed in claim 4, wherein said local oscillator frequency is changed between said first and second values at each successive reception time slot of each of said frames.

10. A method of low Intermediate Frequency quadrature radio reception as claimed in claim 5, wherein said local oscillator frequency is changed between said first and second values at each successive reception time slot of each of said frames.

11. The method of claim 1 further comprising:
    producing further local oscillator signal In-phase and Quadrature components having a further local oscillator frequency.

12. The method of claim 1 further comprising:
    producing further local oscillator signal In-phase and Quadrature components having a further local oscillator frequency; and
    mixing said filtered signal In-phase and Quadrature components with said further local oscillator signal In-phase and Quadrature components and producing baseband signal In-phase and Quadrature components.

13. The method of claim 12 further comprising:

applying alternating phase shifts to said further local oscillator signal In-phase and Quadrature components in synchronism with said changes in said local oscillator frequency.

14. The method of claim 13 further comprising:

alternating mixing of said further local oscillator signal In-phase and Quadrature components between said Intermediate Frequency signal In-phase and Quadrature components in synchronism with changes in said local oscillator frequency to produce alternating pairs of said baseband signal In-phase and Quadrature components.

15. The method of claim 2 further comprising:

alternating mixing of said further local oscillator signal In-phase and Quadrature components between said Intermediate Frequency signal In-phase and Quadrature components in synchronism with changes in said local oscillator frequency to produce alternating pairs of said baseband signal In-phase and Quadrature components.

* * * * *